(12) United States Patent
Eckberg et al.

(10) Patent No.: US 7,375,963 B2
(45) Date of Patent: May 20, 2008

(54) SYSTEM AND METHOD FOR COOLING A MODULE

(75) Inventors: Eric A. Eckberg, Rochester, MN (US); Michael S. Good, Fountain, MN (US); Mark D. Pfeifer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,266

(22) Filed: Apr. 11, 2006

(65) Prior Publication Data

US 2007/0236888 A1 Oct. 11, 2007

(51) Int. Cl.
*H05K 7/20* (2006.01)

(52) U.S. Cl. ............ 361/704; 361/702; 361/712; 361/718; 361/719; 165/80.3; 165/104.33; 165/185; 257/718; 257/719; 257/727; 174/252

(58) Field of Classification Search ........ 360/702–705, 360/709–712, 717–719, 720–721, 760, 769, 360/787, 790, 802, 803; 257/706–712, 717–727; 174/16.3, 250–263; 165/80.3, 185; 439/63–74, 439/487; 248/505, 510

See application file for complete search history.

(56) References Cited

U.S. PATENT DOCUMENTS

| | | | |
|---|---|---|---|
| 4,945,435 A | | 7/1990 | Boigenzahn et al. |
| 5,883,782 A | * | 3/1999 | Thurston et al. ............ 361/704 |
| 5,883,783 A | * | 3/1999 | Turturro ..................... 361/704 |
| 6,545,879 B1 | * | 4/2003 | Goodwin ..................... 361/807 |
| 6,550,113 B2 | * | 4/2003 | Suchy et al. ................... 26/80 |
| 6,657,131 B2 | * | 12/2003 | Gonzalez et al. ............ 174/260 |
| 6,680,848 B2 | * | 1/2004 | Petit et al. ................... 361/704 |
| 6,829,143 B2 | * | 12/2004 | Russell et al. ............... 361/704 |
| 6,929,484 B2 | * | 8/2005 | Weiss et al. ................... 439/66 |
| 7,019,979 B2 | * | 3/2006 | Wang et al. ................. 361/719 |
| 7,042,727 B2 | * | 5/2006 | Ulen et al. ................... 361/704 |
| 7,126,823 B2 | * | 10/2006 | Chen et al. .................. 361/702 |
| 7,209,354 B2 | * | 4/2007 | Wu et al. ..................... 361/697 |

OTHER PUBLICATIONS

U.S. Appl. No. 11/201,972, filed Aug. 11, 2005, Colbert, et al., "Method and Apparatus for Mounting a Heat Sink in Thermal Contact With an Electronic Component".

* cited by examiner

*Primary Examiner*—Michael Datskovskiy
(74) *Attorney, Agent, or Firm*—Cantor Colburn LLP

(57) ABSTRACT

Disclosed herein is a module cooling system, comprising, a module in operable communication with a circuit board, a stiffener abutting the circuit board, a heatsink abutting the module, a first biasing member biasing the heatsink towards the module, a plurality of non-influencing fasteners positionally fixing the heatsink, and a second biasing member biasing the circuit board and module towards the heatsink. Further disclosed herein is a method of mounting a module cooling system, comprising, connecting electrically a module to a circuit board, abutting a stiffener to the circuit board, abutting a heatsink to the module, biasing with a biasing member the heatsink in a direction towards the module, fixing the heatsink with non-influencing fasteners, and biasing with a second biasing member the circuit board and module towards the heatsink.

3 Claims, 4 Drawing Sheets

SYSTEM AND METHOD FOR COOLING A MODULE

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to efficiently cooling electronic circuits, and particularly to cooling circuits through the use of heatsinks.

2. Description of Background

Electronic components, such as microprocessors and integrated circuits, must operate within certain specified temperature ranges to perform efficiently. Excessive heat degrades electronic component performance, reliability, life expectancy, and can even cause failure. Heatsinks are widely used for controlling excessive heat. Typically, heatsinks are formed with fins, pins or other similar structures to increase the surface area of the heatsink and thereby enhance heat dissipation as air passes over the heatsink. In addition, it is not uncommon for heatsinks to contain high performance structures, such as vapor chambers and/or heat pipes, to further enhance heat transfer. Heatsinks are typically formed of metals, such as copper or aluminum. More recently, graphite-based materials have been used for heatsinks because such materials offer several advantages, such as improved thermal conductivity and reduced weight.

Electronic components are generally packaged using electronic packages (i.e., modules) that include a module substrate to which the electronic component is electronically connected. In some cases, the module includes a cap (i.e., a capped module), which seals the electronic component within the module. In other cases, the module does not include a cap (i.e., a bare die module).

Bare die modules are generally preferred over capped modules from a thermal performance perspective. In the case of a capped module, a heatsink is typically attached with a thermal interface between a bottom surface of the heatsink and a top surface of the cap, and another thermal interface between a bottom surface of the cap and a top surface of the electronic component. In the case of a bare die module, a heatsink is typically attached with a thermal interface between a bottom surface of the heatsink and a top surface of the electronic component. Bare die modules typically exhibit better thermal performance than capped modules because bare die modules eliminate two sources of thermal resistance present in capped modules, i.e., the thermal resistance of the cap and the thermal resistance of the thermal interface between the cap and the electronic component. Accordingly, bare die modules are typically used to package electronic components that require high total power dissipation.

Heatsinks are attached to modules using a variety of attachment mechanisms, such as clamps, screws, and other hardware. The attachment mechanism typically applies a force that maintains a thermal interface gap, i.e., the thickness of the thermal interface extending between the heatsink and the module. In the case of a capped module, the cap protects the electronic component from physical damage from the applied force. In the case of a bare die module, however, the applied force is transferred directly through the electronic component itself. Consequently, when bare die modules are used, the attachment mechanism typically applies a compliant force to decrease stresses on the electronic component.

Typical methods and designs used to control the thermal interface gap, while not putting excessive mechanical loads onto the module, include many components and are thus complex, expensive and take up valuable real-estate that could be put to better use by packaging more circuit components. Accordingly, there is a need in the art for a smaller, less complex and less expensive module-to-heatsink mounting arrangement.

SUMMARY OF THE INVENTION

The shortcomings of the prior art are overcome and additional advantages are provided through the provision of a module cooling system, comprising, a module with a center in operable communication with a circuit board, a stiffener abutting the circuit board on a side of the circuit board opposite a side at which the module is disposed, a heatsink abutting the module on a side of the module opposite a side at which the circuit board is disposed, a first biasing member biasing the heatsink relative to the stiffener towards the center of the module, a plurality of non-influencing fasteners positionally fixing the heatsink relative to the stiffener, and a second biasing member biasing the circuit board and module towards the heatsink relative to the stiffener.

Further disclosed herein is a method of mounting a module cooling system, comprising, connecting electrically a module with a center to a circuit board, abutting a stiffener to the circuit board on a side of the circuit board opposite a side at which the module is disposed, abutting a heatsink to the module on a side of the module opposite a side at which the circuit board is connected, biasing with a first biasing member the heatsink in a direction towards the center of the module relative to the stiffener, fixing the heatsink relative to the stiffener with non-influencing fasteners, and biasing with a second biasing member the circuit board and module towards the heatsink relative to the stiffener.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which efficiently couples a heatsink to a circuit for dissipation of heat therefrom.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
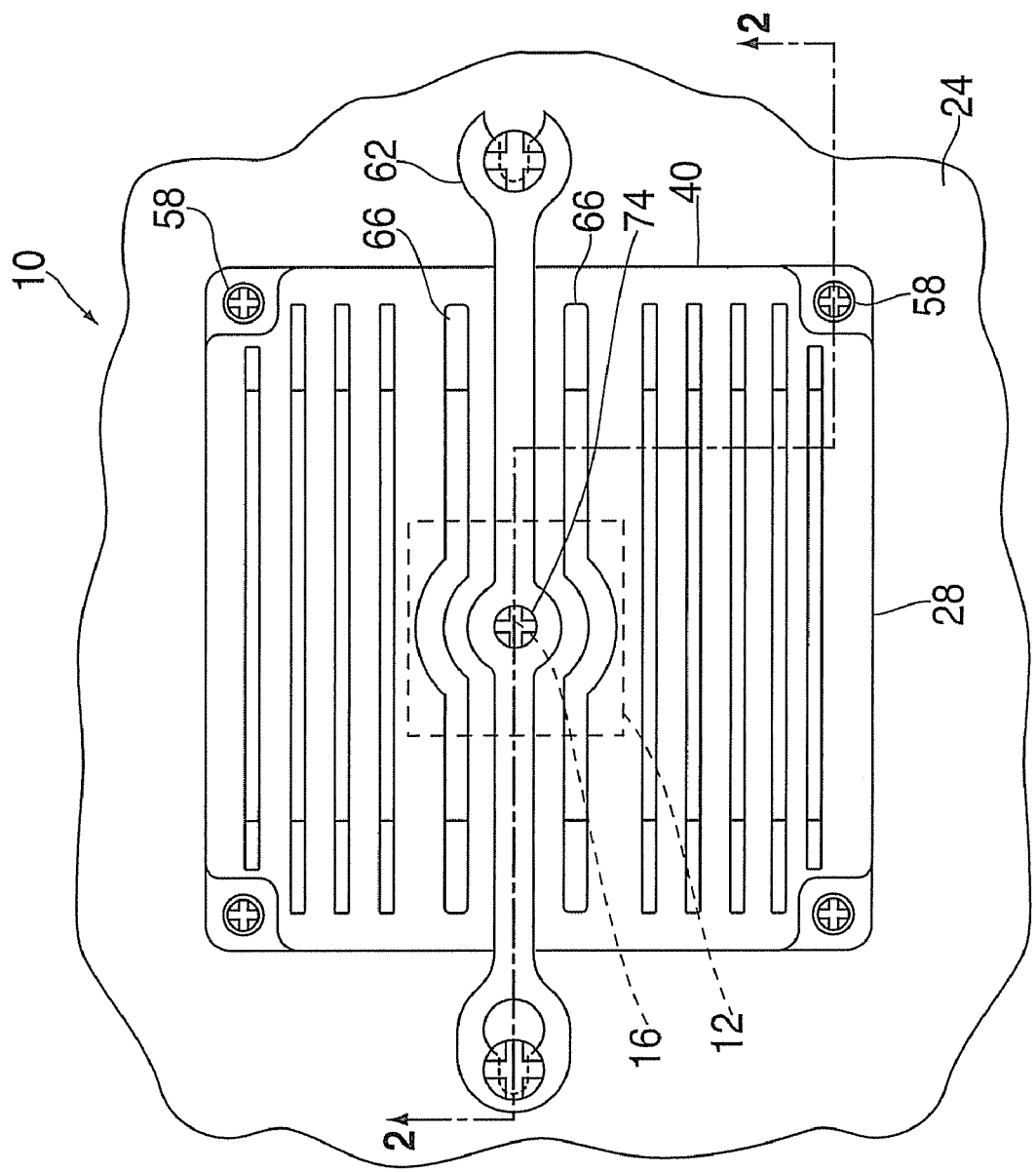
FIG. 1 illustrates one example of a plan view of a module cooling system disclosed herein.
Figure 2:
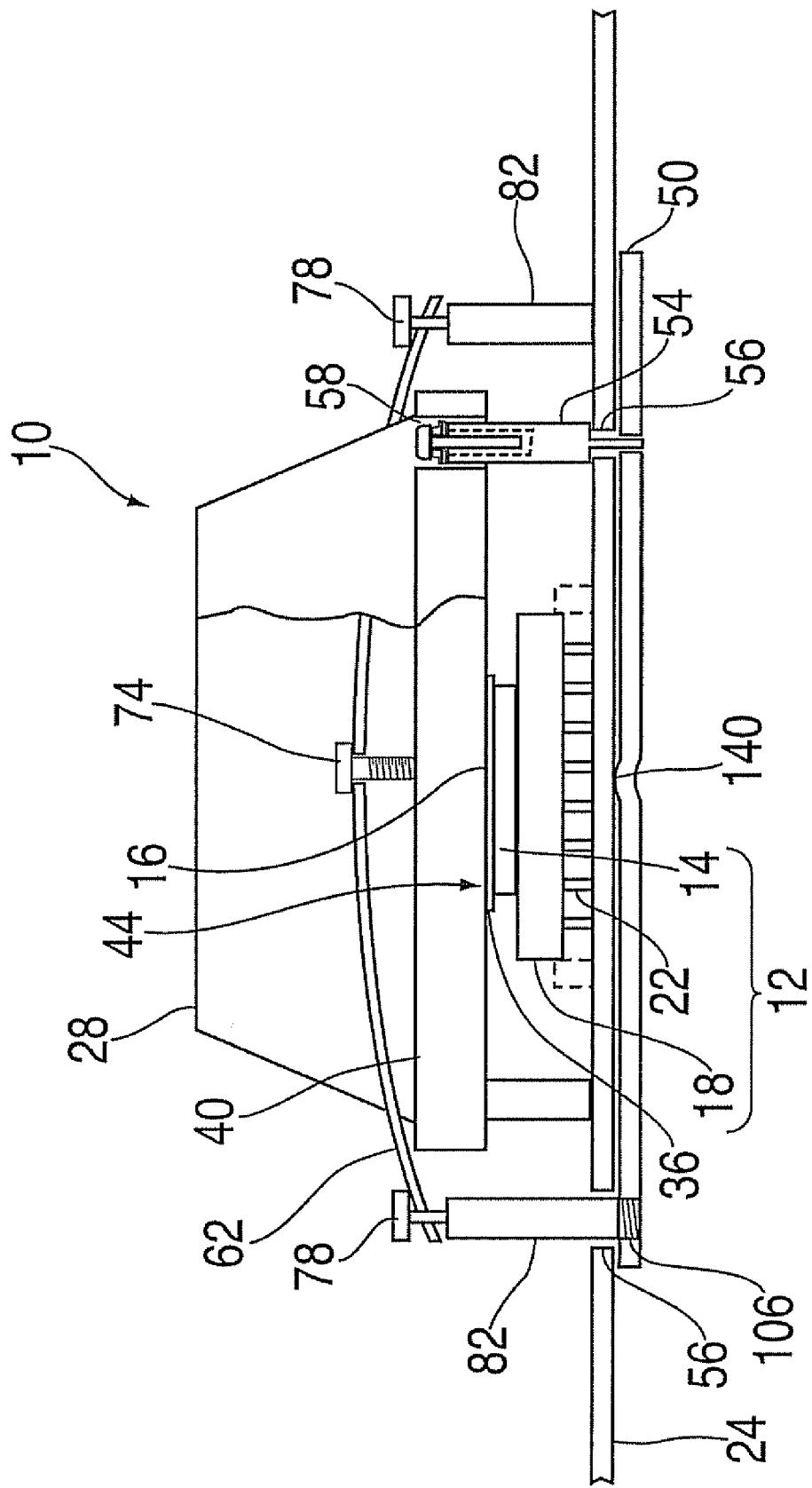
FIG. 2 illustrates one example of a cross sectional front view of the module cooling system of FIG. 1 taken at arrows 2-2.

Referring to FIGS. 1 and 2, a module cooling system according to an embodiment of the invention is shown generally at 10. A bare die module 12 comprising an electronic component such as a semiconductor chip 14, a module substrate 18, and an electronic connector 22 generates heat that requires dissipation. The bare die module shown in FIG. 1 is a single-chip module (SCM); however, those skilled in the art will recognize that the spirit and scope of the present invention is not limited to SCMs. For example, those skilled in the art will recognize that the present invention may be practiced using a multi-chip module (MCM) or other electronic components/heat sources. The semiconductor chip 14 is electrically connected to the module substrate 18 in a center 16 of the module 12. Electronic connector 22, which electrically connects printed circuit board 24 to module substrate 18, may be a pin grid array (PGA), a ceramic column grid array (CCGA), a land grid array (LGA), or the like.

Referring to FIGS. 1 and 2, a module cooling system according to an embodiment of the invention is shown generally at 10. A bare die module 12 comprising an electronic component such as a semiconductor chip 14, a module substrate 18, and an electronic connector 22 generates heat that requires dissipation. The bare die module shown in FIG. 1 is a single-chip module (SCM); however, those skilled in the art will recognize that the spirit and scope of the present invention is not limited to SCMs. For example, those skilled in the art will recognize that the present invention may be practiced using a multi-chip module (MCM) or other electronic components/heat sources. The semiconductor chip 14 is electrically connected to the module substrate 18 in a center 16 of the module 12. Electronic connector 22, which electrically connects printed circuit board 24 to module substrate 18, may be a pin grid array (PGA), a ceramic column grid array (CCGA), a land grid array (LGA), or the like.

In order to dissipate the heat generated in the module 12 a heatsink 28 is pressed against the module 12 with a thermally conductive material therebetween forming a thermal interface 36. The thermal interface 36 is made of a thermally conductive material such as thermal gel, grease, paste, oil, gas, solid or other material with a high thermal conductivity. Typically, the thermal interface 36 is relatively thin so that it may easily transfer heat away from semiconductor chip 14 and toward the heatsink's base plate 40. The thickness of thermal interface 36 extending between the bottom of the heatsink's base plate 40 and the top surface of semiconductor chip 14 is referred to as the thermal interface gap 44. In one embodiment, the thermal interface gap 44 is about 1.2 mil.

In addition to providing uniform heat dissipation for the module 12 the thermal interface gap 44 provides a damping effect. This damping effect reduces the vibration, and other mechanical transient loads, that impacts the heatsink 28 before it reaches the module 12. The mounting and loading of the heatsink 28 relative to the module 12 is therefore very important and is described in the following embodiments in detail.

Figure 3:
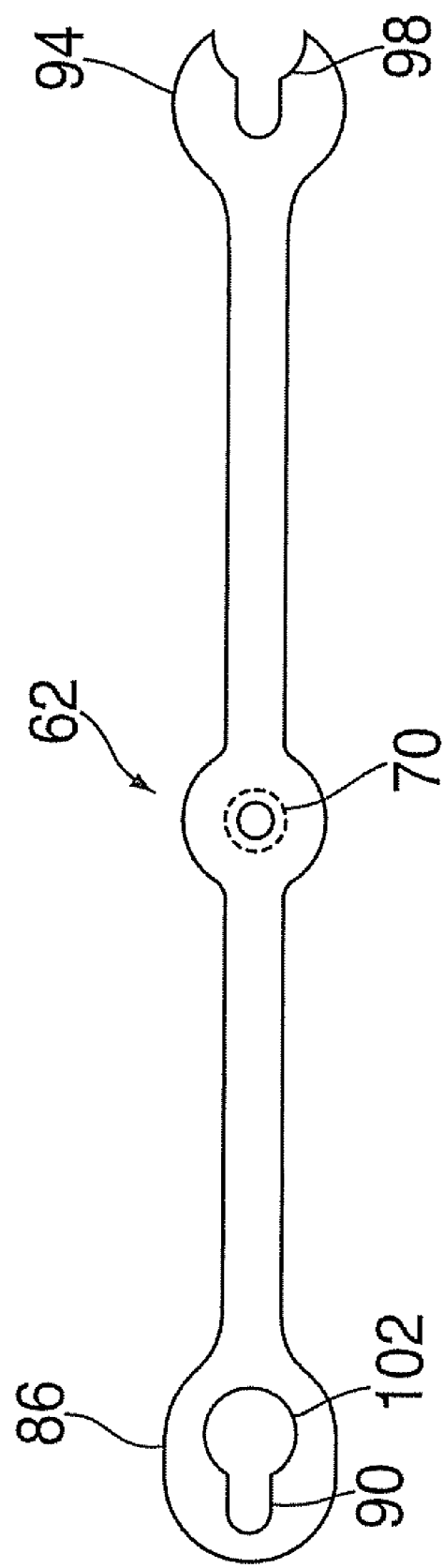
FIG. 3 illustrates one example of a plan view of a biasing spring disclosed herein.

A stiffener 50, made of a strong material such as stamped metal, is abutted to the circuit board 24 on the side opposite of the module 12. Threaded non-influencing fastener (NIF) standoffs 54 screw into the stiffener 50 through holes 56 in the board 24 thereby fixing the board 24 to the stiffener 50. Four holes 58 in the corners of the heatsink 28 slidably engage the NIF standoffs 54 and positionally center the heatsink 28 above the module 12. A spring 62, as shown in FIG. 3, slidably engages center cooling fins 66 of the heatsink 28 and is thereby centered relative to the heatsink 28. The spring 62 includes a threaded hole 70 at its center for receiving a screw 74. The centering of the spring 62 relative to the heatsink 28 and the centering of the heatsink 28 relative to the module 12 assures that the screw 74 and its receiving threaded hole 70 are centered above the module 12.

Ends of the spring 62, as best seen in FIG. 3, receive heads 78 on heatsink load posts 82. A first end 86 of the spring 62 has a keyhole 90, while a second end 94 has a slot 98. Since the round portion 102 of the keyhole 90 is larger than the head 78 of the lead posts 82 the spring 62 can be placed over the heads 78 of two load posts 82 and then moved relative to the lead posts 82 thereby locking the ends 86 and 94 under the heads 78. A pair of heatsink load posts 82 threadably engaged with holes 106 in the stiffener 50, through holes 56 in the board 24, are positioned apart by the same distance as the ends 86 and 94 of the spring 62, and are positioned such that the spring 62 fits between the center fins 66 of the heatsink 28.

The aforementioned structure allows the heatsink 28 to be centrally spring loaded over the module 12 by tightening a screw 74 into the center hole 70 of the spring 62. The further the screw 74 is screwed into the spring 62, the more the center of the spring 62 deflects, and the higher the force applied to the heatsink 28, and, correspondingly, the higher the force between the heatsink 28 and the module 12. The central location of the force application assures uniformity of pressure of the thermally conductive material and the corresponding uniformity of the thermal interface gap 44. Several methods may be employed to create and control the force, such as turning the screw 74 a predefined number of rotations, or turning the screw 74 until its head bottoms out against the spring 62, for example.

Figure 4:
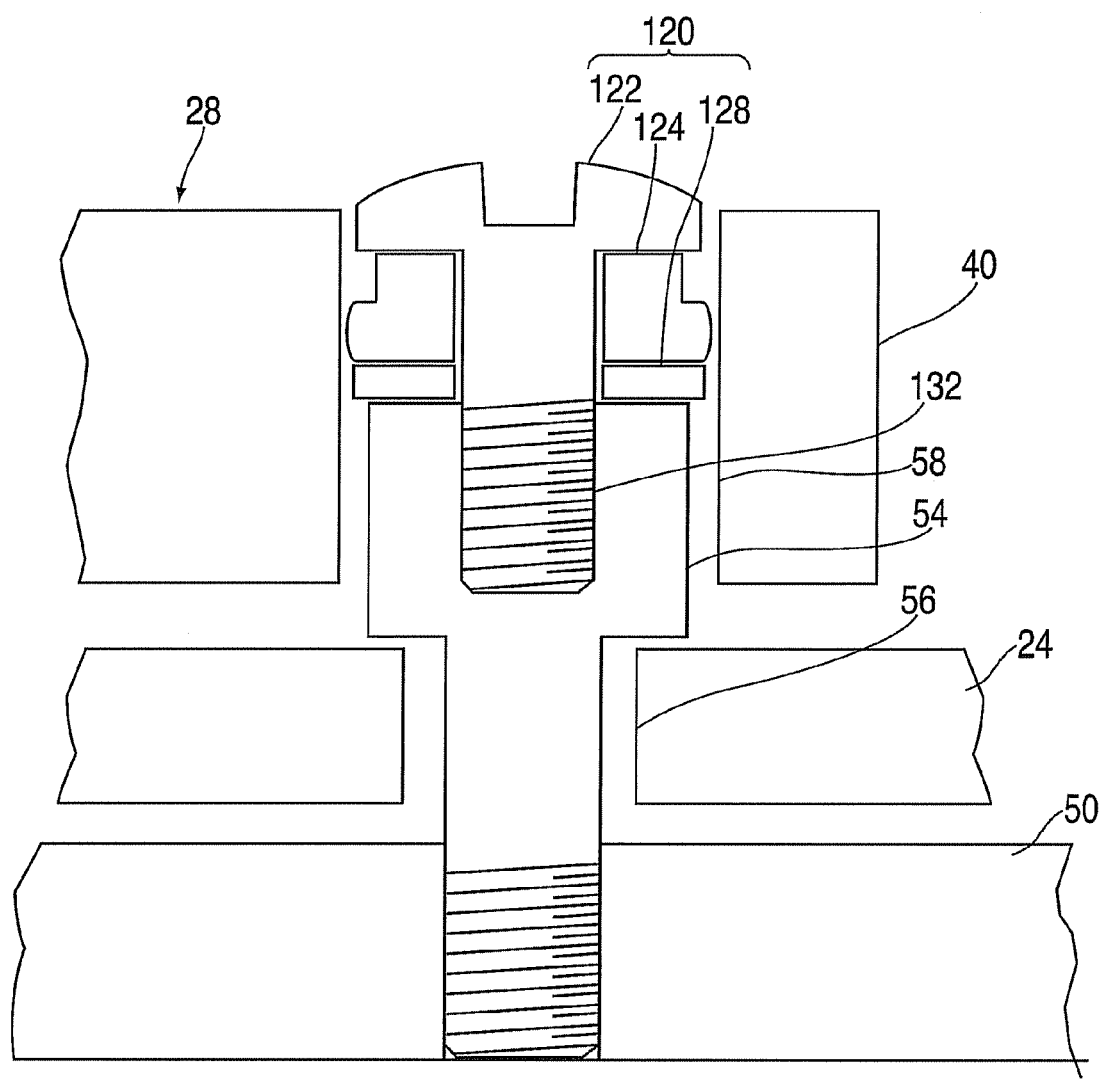
FIG. 4 illustrates one example of a cross sectional view of a non-influencing fastener positionally fixing a heatsink to a stiffener disclosed herein.

The heatsink 28 may be massive enough to require additional structural attachment, to for example the stiffener 50, than is provided by the spring 62 alone. Therefore, embodiments may lock the heatsink 28 to the stiffener 50 through the use of non-influencing fasteners (NIF) 120. Referring to FIG. 4 the NIF 120 includes a NIF screw 122, a resilient member 124 and, optionally, a washer 128. The NIF screw 122 threads into a threaded hole 132 in the NIF standoffs 54 which are slidably engaged with holes 58 in the base plate 40 of the heatsink 28. Tightening of the NIF screw 122 causes the resilient member 124 to compress and expand radially outward until it frictionally engages with the hole 58 thereby positionally locking the heatsink 28 to the stiffener 50. Structurally supporting the heatsink 28 through the NIFs 120 to the stiffener 50 may remove the potentially damaging dynamic loads that the heatsink 28 could place upon the module 12.

Referring again to FIG. 2, a biasing load is applied between the stiffener 50 and the circuit board 24 through the raised surface 140 in the stiffener 50. The flexing of the stiffener 28, the board 24 or both, generates this biasing load.

By locating the raised surface 140 central relative to the module 12, the biasing load will act to maintain a uniform thermal interface gap 44. The amount of force created by the raised surface 140 can be accurately set by the design of the raised surface 140 relative to points where the NIF standoffs 54 attach to the stiffener 50. Additional ribbing of the stiffener 50 or the addition of a separate pad of alternate material (not shown) could also be incorporated to create specific characteristics of the biasing load.

Embodiments of the invention may have some of the following advantages: a first biasing force applied to a heatsink centrally relative to a module, accurate control of the first biasing force, removal of the first biasing force upon completion of the circuit board assembly, structural support of the heatsink to a stiffener in multiple locations, and a continuously applied centrally loaded biasing force after completion of the assembly.

While the embodiments of the disclosed system and method have been described with reference to exemplary embodiments, it will be understood by those skilled in the art that various changes may be made and equivalents may be substituted for elements thereof without departing from the scope of the embodiments of the disclosed system and method. In addition, many modifications may be made to adapt a particular situation or material to the teachings of the embodiments of the disclosed system and method without departing from the essential scope thereof. Therefore, it is intended that the embodiments of the disclosed system and method not be limited to the particular embodiments disclosed as the best mode contemplated for carrying out the embodiments of the disclosed system and method, but that the embodiments of the disclosed system and method will include all embodiments falling within the scope of the appended claims.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of mounting a module cooling system, comprising:

connecting electrically a module with a center to a circuit board;

abutting a stiffener to the circuit board on a side of the circuit board opposite a side at which the module is disposed;

abutting a heatsink to the module on a side of the module opposite a side at which the circuit board is connected;

biasing the heatsink in a direction towards the center of the module relative to the stiffener with a single positionally adjustable point of contact of a first biasing member;

fixing the heatsink relative to the stiffener with fasteners; and biasing the circuit board and module towards the heatsink relative to the stiffener with a single raised surface point of contact as a second biasing member.

2. The method of claim 1, further comprising:

positioning a thermal interface between the module and the heatsink.

3. The method of claim 1, further comprising:

forming a raised surface in the stiffener to act as the second biasing member.

* * * * *